United States Patent
Hamburgen

(10) Patent No.: US 7,302,751 B2
(45) Date of Patent: Dec. 4, 2007

(54) METHOD OF FABRICATING A RAT'S NEST RFID ANTENNA

(75) Inventor: William Hamburgen, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 410 days.

(21) Appl. No.: 10/837,336

(22) Filed: Apr. 30, 2004

(65) Prior Publication Data

US 2005/0241146 A1    Nov. 3, 2005

(51) Int. Cl.
*H01P 11/00*    (2006.01)

(52) U.S. Cl. ............ 29/600; 29/601; 29/832; 340/572.7; 343/872

(58) Field of Classification Search .......... 29/825–834, 29/855, 858, 600, 601, 602.1; 340/572.7, 340/572.8, 572.5; 343/872, 873; 83/495, 83/477; 235/492, 462, 13
See application file for complete search history.

(56) References Cited

U.S. PATENT DOCUMENTS

| | | | | |
|---|---|---|---|---|
| 5,566,441 A | * | 10/1996 | Marsh et al. | 29/600 |
| 5,682,143 A | | 10/1997 | Brady et al. | |
| 6,107,920 A | * | 8/2000 | Eberhardt et al. | 340/572.7 |
| 6,147,662 A | * | 11/2000 | Grabau et al. | 343/895 |
| 6,155,247 A | * | 12/2000 | Akram et al. | 125/23.01 |
| 6,404,339 B1 | * | 6/2002 | Eberhardt | 340/572.1 |
| 6,496,113 B2 | * | 12/2002 | Lee et al. | 340/572.7 |
| 6,534,386 B2 | * | 3/2003 | Irie | 438/464 |
| 7,117,581 B2 | * | 10/2006 | Arneson et al. | 29/600 |
| 2004/0020036 A1 | | 2/2004 | Arneson et al. | |
| 2005/0241146 A1 | * | 11/2005 | Hamburgen | 29/825 |

FOREIGN PATENT DOCUMENTS

WO    WO 02/099743    12/2002

OTHER PUBLICATIONS

Youbok Lee, Ph.D.; Antenna Circuit Design for RFID Applications; 2003Microchip Technology Inc.:Microchip AN710; p. 1-50, 2003.
By Nathan cohen and John Chenoweth; The Advantage of the Comcyl Approach Is That It Does Not Suffer From the Inefficiencies of Conventional Stubby Designs; Excerpted From Wireless Systems Design 1999; WSD Application Notes-Stubby Antennas Take New Approach; pp. 1-3, 1999.
CAPTENNA 900; 2002 Fractal Antenna Systems, Inc; www.fractenna.com.
Tagtenna900; 2001 Fractal Antenna Systems, Inc.; www.fractenna.com.
Radio Frequency Identification—RFID a Basic Primer; Type: Aim, Inc. White Paper; Doc Version: 1.11, Sep. 28, 1999; The Aim Global Network Standards.

(Continued)

*Primary Examiner*—Minh Trinh

(57) ABSTRACT

A method of fabricating a radio frequency identification (RFID) antenna on a substrate is disclosed. The antenna is fabricated on a substrate that includes already fabricated RFID chips. The substrate is connected with a carrier substrate and singulated to separate the plurality of RFID chips into a plurality of diesites. The antenna is connected to a RFID chip in an assembly order to form an a RFID tag. The method is repeated such that each successively connected antenna overlaps a previously connected antenna.

17 Claims, 17 Drawing Sheets

OTHER PUBLICATIONS

Electronic Numbering of Products and Documents Using the "U-Chip" (or MU-Chip Supported by a Networked Database Unleashes New Business and Life Style Applications That Facilitate Innovative Manufacturing, Distribution, Consumption, Tracking and Recycling Operations.; The World's Smallest RFID Inc.; © Hitachi, Ltd, 2002, 2004.

Origin of RFID; How RFID works . . . www.smartid.com.sg/RFID. htm, 2004.

Images of rfid tags; www.spychips.com/tag_images.html, Caspian 2003-2004.

ISSCC 2003/Session22/ TD: Embedded Technologies/Pater 22.7; Powder LSI: An Ultra Small RF Identification Chip for Individual Recognition Applications, 2003.

What is radio frequency identification (RFID)7; The Association for Automatic Identification and Data Capture Technologies;The AIM Global Network—standards, published 1994.

AIM- The Association of the Automatic Identification and Data Capture Industry; Draft Paper on the Characteristics of RFID-Systems; Jul. 2000; AIM Frequency Forums AIM FF 2000:001 Ver 1.0.

* cited by examiner

METHOD OF FABRICATING A RAT'S NEST RFID ANTENNA

FIELD OF THE INVENTION

The present invention relates generally to a method of fabricating a rat's nest radio frequency identification (RFID) antenna. More specifically, the present invention relates to a method of fabricating a RFID antenna on a RFID chip die while the die is still attached to a substrate.

BACKGROUND OF THE ART

Radio frequency identification (RFID) is a technology that has been in use since the 1940's where military aircraft carried large transponders as part of an IFF (Identify Friend-or-Foe) system. The transponder received electrical power from the aircraft and was thus an active RFID transponder. When a radar signal interrogated the transponder the transponder would generate a specific radio frequency signal that identified the aircraft as a "friendly" aircraft. This IFF system prevented otherwise friendly aircraft from being shot down by other friendly aircraft or friendly military forces.

State of the art microelectronics technology now make it possible to fabricate very small analog (e.g. RF circuitry) and digital (e.g. Memory) circuits on silicon (Si). As a result, RFID technology is currently being used to obtain information stored on a RFID tag that is a much smaller version of the aforementioned large RFID transponder used for aviation IFF. At its most basic, a RFID system includes a RFID reader and one or more RFID tags that are attached to an object to be identified.

The RFID reader transmits a radio frequency signal that creates an electromagnetic field. The RFID tags include electronics that store information about the object the tag is attached to. For example, the object can be a piece of merchandise, a food article, currency, a product, a component passing through a manufacturing process, an automobile, or a piece of luggage. The RFID tag also includes an antenna and electronics connected with the antenna for receiving a specific radio signal and for transmitting the stored information at a specific radio frequency when the RFID tag enters the electromagnetic field generated by the RFID reader.

A RFID tag can be an active tag or a passive tag. An active RFID tag includes a power source, such as a battery, for example. Upon entering the electromagnetic field generated by the RFID reader, the active RFID tag extracts data from the electromagnetic field and then transmits its own information carrying radio signal to the RFID reader. In contrast, a passive RFID tag does not include a power source. Instead, the electromagnetic field generated by the RFID reader induces an AC voltage in the antenna of the passive RFID tag and that induced voltage is then rectified to produce a DC voltage that energizes the passive RFID tag. Once energized, the passive RFID tag transmits an information carrying radio signal to the RFID reader. Due to the requirement of a power source, active RFID tags are typically larger and more costly than passive RFID tags.

In FIG. 1, a substrate 400 includes a plurality of RFID chips 401 that include an area $a_1$. The substrate 400 can be a wafer of a semiconductor material such as silicon (Si), for example. The substrate 400 can include a wafer flat 400f and scribe lines 402s that delineate the RFID chips 401 and allow the RFID chips 401 to be separated from one another.

A designer of an RFID chip 401 is faced with two fundamental choices between using an on-chip antenna 405 as depicted in FIG. 2a or an external antenna (421, 431) as depicted in FIGS. 2b, 3a, and 3b. In FIG. 1, The RFID chip 401 can include the on-chip antenna 405 positioned within an outer perimeter $p_1$ of the chip 401, RFID electronics 403 that occupy a smaller area $a_2$, and conductive traces or bonding wires 413 that electrically connect nodes (415, 417) on the RFID electronics with nodes (407, 409) on the on-chip antenna 405.

If the on-chip antenna 405 can be accommodated on-chip without increasing the area $a_1$ of the RFID chip 401, then the RFID chip 401 will offer the lowest possible RFID tag cost because tag cost is directly proportional to the area $a_1$. However, one disadvantage of the on-chip antenna 405 is that unless the chip 401 is large, the on-chip antenna 405 will offer only a very limited range. That is, the chip 401 must be in very close proximity to the RFID reader in order to receive the electromagnetic field and to transmit the information stored on the RFID chip 401 to the RFID reader. The range may be adequate in some cases, but in general more range is better. Another disadvantage of on-chip antennas is that scaling of the RFID chip 401 to smaller chip sizes (i.e. reducing the area $a_1$ thereby reducing tag cost) is largely precluded because shrinking the on-chip antenna 405 will seriously impact the range of the RFID chip 401 and/or reduce a data rate at which the information is transmitted from the RFID chip 401 to the RFID reader.

On the other hand, by using an external antenna as depicted in FIGS. 2b, 3a, and 3b, the range of the RFID chip 401 can be greatly increased, but at a substantial increase in tag cost. The increase in tag cost can be attributed in large part to: a cost of manufacturing the external antenna (421, 431); a cost of mounting the RFID chip 401 to a substrate 451 that carries the antenna 431; and a cost of making an electrical connection (between the RFID chip 401 and the external antenna (421, 431). For example, in FIGS. 2b, 3a, and 3b, a wire bonding process can be used to connect a wire 413 with nodes (415, 417) on the RFID chip 401 and with nodes (423, 425) on the external antenna (421, 431). Solder balls 444 or other techniques that are well understood in the microelectronics art (e.g. surface mount technology) can be used to electrically connect the RFID chip 401 with the external antenna (421, 431).

The process of connecting the RFID chip with the external antenna is a non-trivial process that increases the cost of the RFID tag, especially when the RFID chip 401 is much smaller than the external antenna (421, 431) as is often the case when large external antennas are used. For example, the μ-chip™ by HITACHI® has a size that is 0.4 mm*0.4 mm, which is much smaller than a grain of rice; however, the external antenna that is connected with the μ-chip™ is substantially larger than the μ-chip™ itself. Much effort has been expended in recent years to develop a low-cost means for connecting a small RFID chip to a large external antenna. As one example, Alien Technology® claims a RFID tag cost of less than $0.10 in high volumes for RFID chips that are connected with a large external antenna using fluidic self assembly (FSA) techniques. HITACHI® with its μ-chip™ and other makers of RFID tags have developed their own approaches to solving the problem of connecting a small RFID chip to a large external antenna. As another example, a current cost per unit area for a RFID chip fabricated on silicon (Si) is on the order of $0.20/sq-mm and with a RFID chip size of 0.4 mm on a side, the cost for the bare RFID chip (i.e. absent the external antenna) would be roughly $0.03 per RFID chip (i.e. $0.20/mm²*[0.4 mm*0.4 mm]=$0.03 per RFID chip). Therefore, the total cost of a complete RFID tag would then be determined by the cost of the large external antenna and the cost of connecting the antenna to the RFID chip.

Consequently, there exists a need for a RFID tag with a cost that approaches that of an on-chip antenna, but with a performance approaching that of a separately fabricated and much more expensive external antenna. There is also a need for a low cost method of fabricating a RFID tag with a low cost antenna that uses a low cost means for connecting the antenna with a RFID chip and would add little to a cost of even the smallest RFID chips.

SUMMARY OF THE INVENTION

The method of the present invention solves the aforementioned needs by connecting a plurality of antenna in an assembly order to a plurality of previously fabricated RFID chips while the RFID chips are still connected with a carrier substrate. The method includes connecting a substrate that carries the previously fabricated RFID chips with a carrier substrate and then singulating the substrate to separate the plurality of RFID chips into a plurality of diesites so that each RFID chip can be processed as a discrete die. In a predetermined assembly order, an antenna is connected with a selected RFID chip to form a RFID tag. A first portion of the antenna is positioned opposite a quadrant defined by a diesite corner of the die the antenna is connected with. A second portion of the antenna is positioned outside a perimeter of the RFID chip. The connecting of additional antenna to additional RFID chips in the assembly order can be repeated as necessary with each successively connected antenna overlapping a previously connected antenna. Essentially, the connected antennas form a rat's nest of antennas. Subsequently, the RFID tags can be removed from the carrier substrate in a disassembly order and optionally attached to a host object.

The rat's nest antenna approach falls in between RFID tags with on-chip antenna and RFID tags with external antenna in both cost and performance. The antenna can be connected with the RFID chip using low-cost wire bonding techniques and the antenna can be a wire made from a low cost material such as aluminum (Al) or copper (Cu). Consequently, the rat's nest antenna adds little to the cost of even the smallest RFID chips. Because the antenna can be substantially larger than the RFID chip, the rat's nest antenna overcomes the performance limitations of small on-chip antennas.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 6b through 6d are detailed cross-sectional views of a section II of FIG. 6a.

FIG. 11a is a top plan view depicting a RFID tag in which an area enclosed by an antenna is greater than an area of an RFID chip the antenna is connected with.

DETAILED DESCRIPTION

Figure 1:
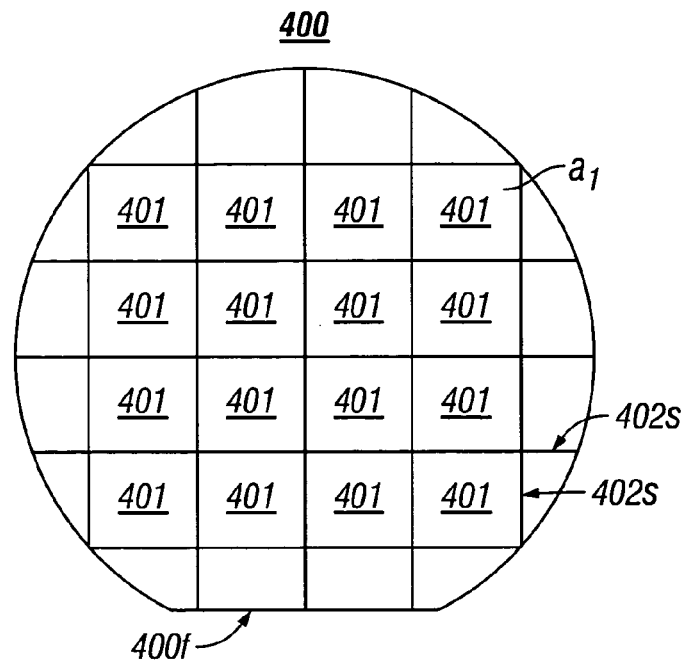
FIG. 1 is a top plan view depicting a prior substrate including a plurality of prior RFID chips.
Figure 2A:
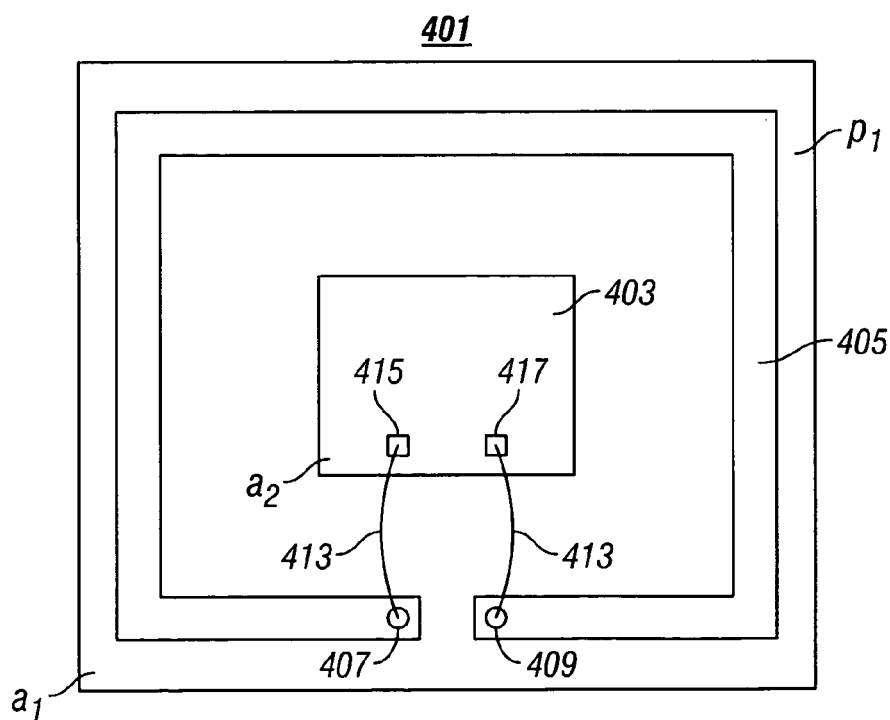
FIG. 2a is a top plan view depicting a prior RFID tag with an on-chip antenna.
Figure 2B:
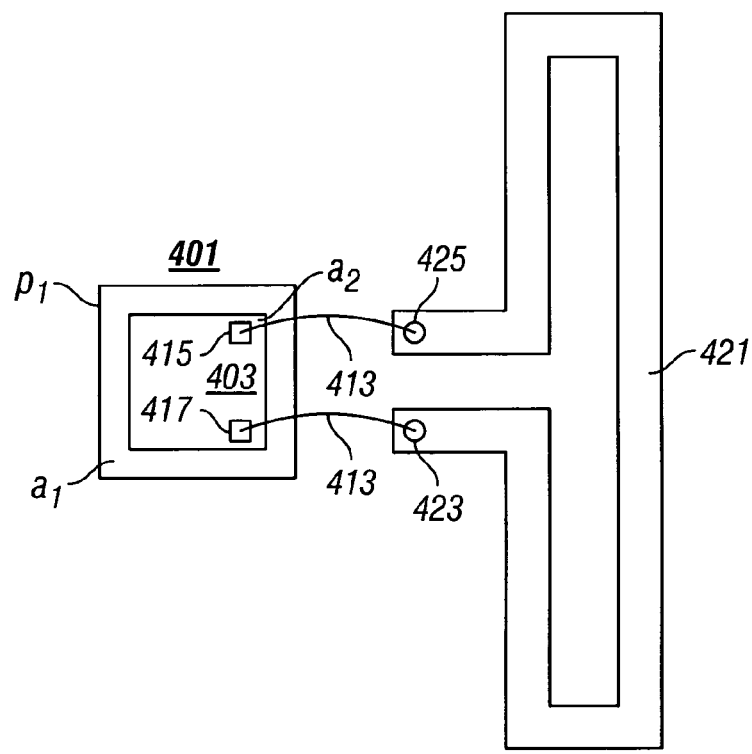
FIG. 2b is a top plan view depicting a prior RFID tag with an external antenna.
Figure 3A:
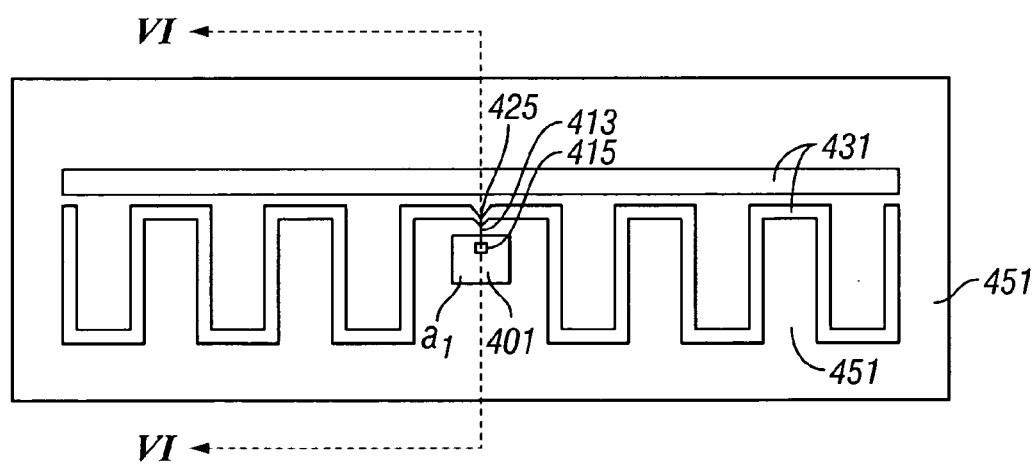
FIG. 3a is a top plan view depicting a prior RFID tag mounted on a substrate with an external antenna.
Figure 3B:
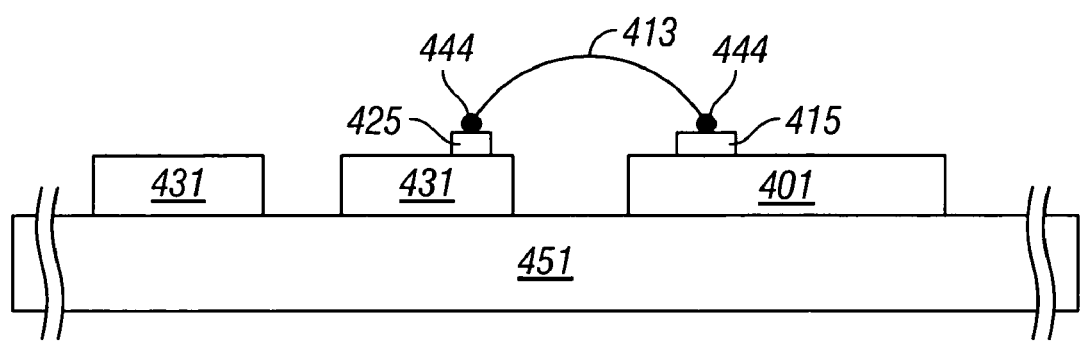
FIG. 3b is a cross-sectional view along a line VI-VI of FIG. 3a and depicts an electrical connection between a prior RFID chip and an external antenna.

In the following detailed description and in the several figures of the drawings, like elements are identified with like reference numerals.

As shown in the drawings for purpose of illustration, the present invention is embodied in method of fabricating an antenna on a substrate including a plurality of previously fabricated RFID chips.

Figure 5A:
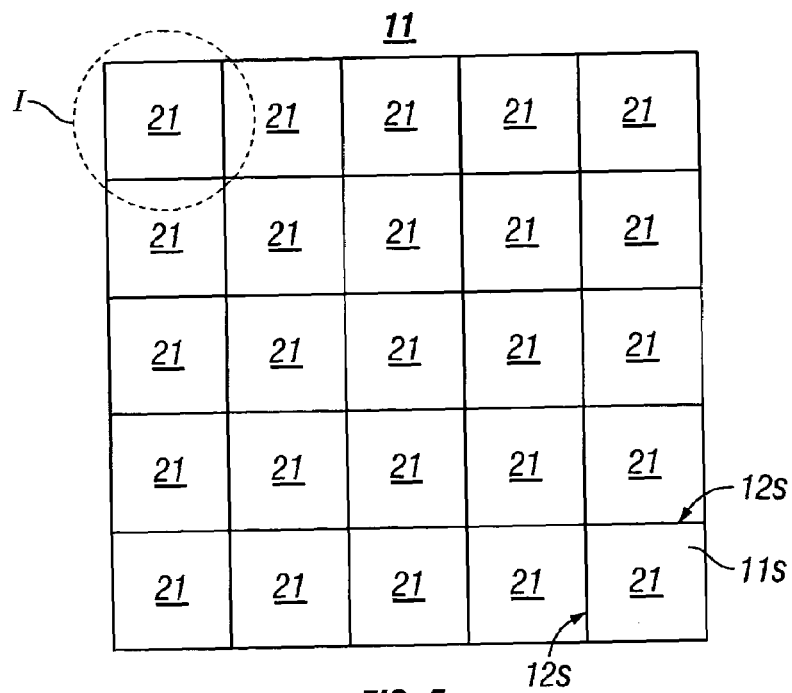
FIGS. 5a and 5b are top plan views depicting a substrate including a plurality of RFID chips.
Figure 5B:
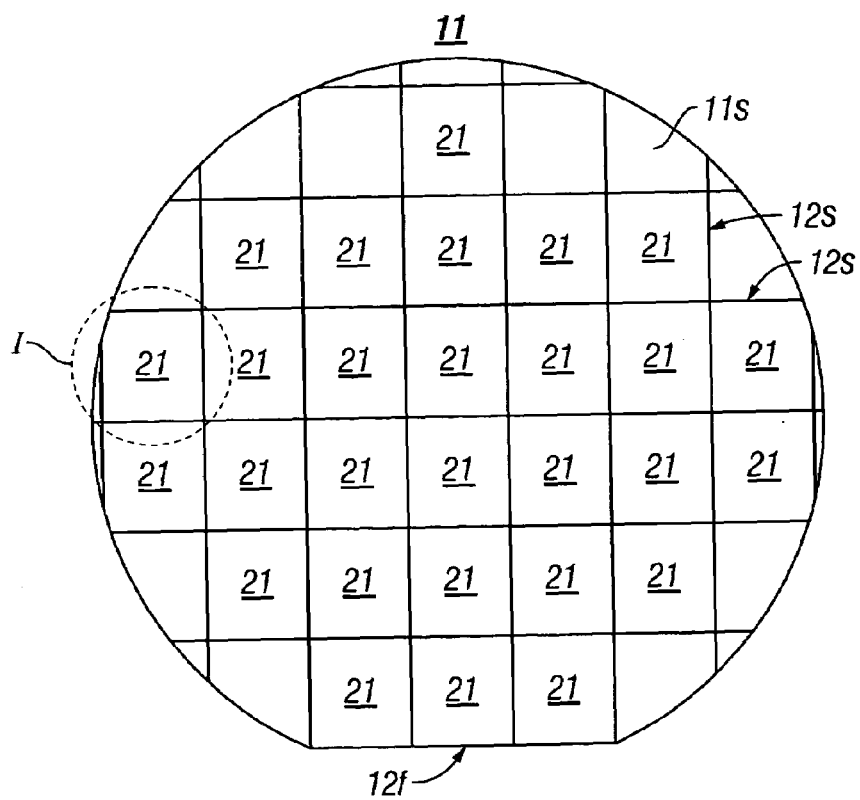

In FIGS. 5a and 5b, a substrate 11 includes a plurality of RFID chips 21 that have been previously fabricated on the substrate 11. Accordingly, one of ordinary skill in the art will appreciate that the RFID chips 21 can be fabricated using processes that are well understood in the microelectronics art and that the RFID chips 21 can include RF circuitry, analog circuitry, and digital circuitry. The substrate 11 can be made from a material including but not limited to a semiconductor material, silicon (Si), and a silicon wafer such as the type commonly used in the fabrication of microelectronic devices. The substrate 11 can have a shape including but not limited to a rectangular shape as depicted in FIG. 5a or a circular shape as depicted in FIG. 5b. The circular shape can be a wafer that includes a wafer flat 12f.

Figure 4A:
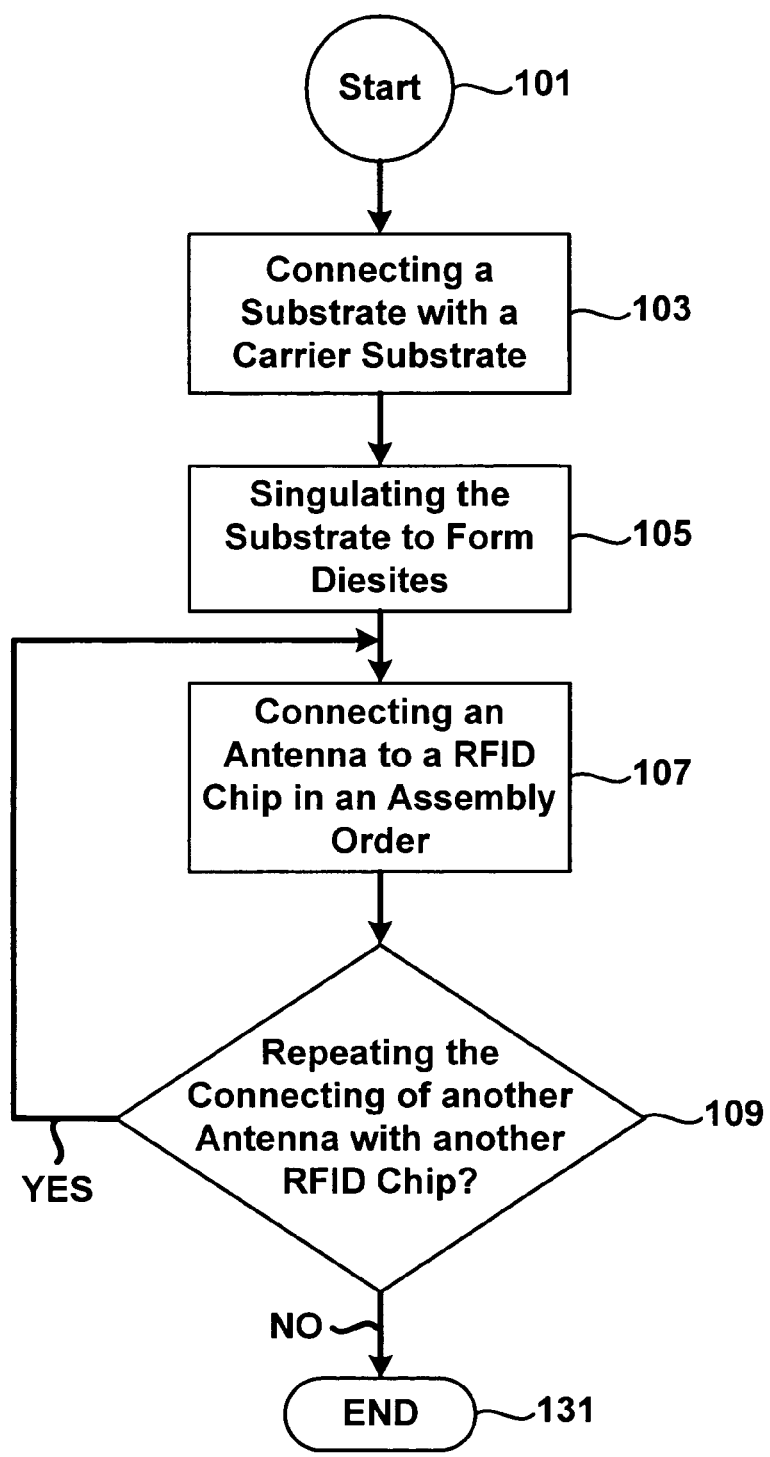
FIGS. 4a and 4b are flow diagrams depicting a method of fabricating an antenna on a substrate.
Figure 6A:
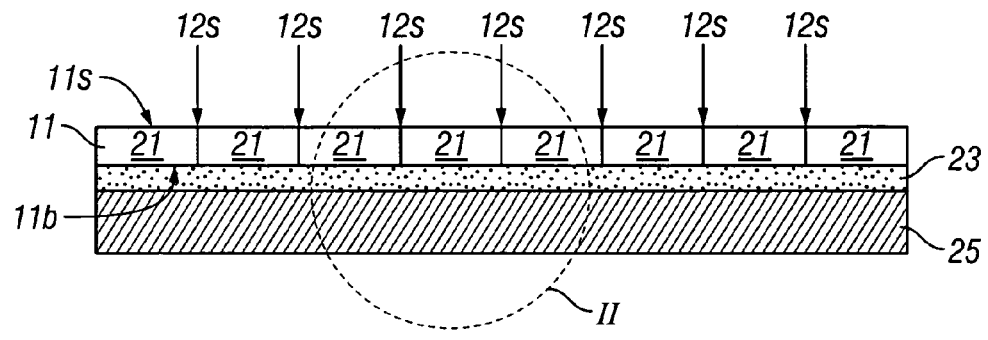
FIG. 6a is cross-sectional view depicting a singulated substrate.

In FIG. 6a and referring to the flow diagram of FIG. 4a, at a stage 103, the substrate 11 is connected with a carrier substrate 25. A variety of methods can be used to connect the substrate 11 with the carrier substrate 25. Those methods include but are not limited to using an adhesive to adhesively connect the substrate 11 with the carrier substrate 25 and using a glue to glue the substrate 11 and the carrier substrate 25 to each other. The carrier substrate 25 serves as a stable platform or foundation upon which to carry out additional fabrication steps on the RFID chips 21 as will be described below.

Figure 7:
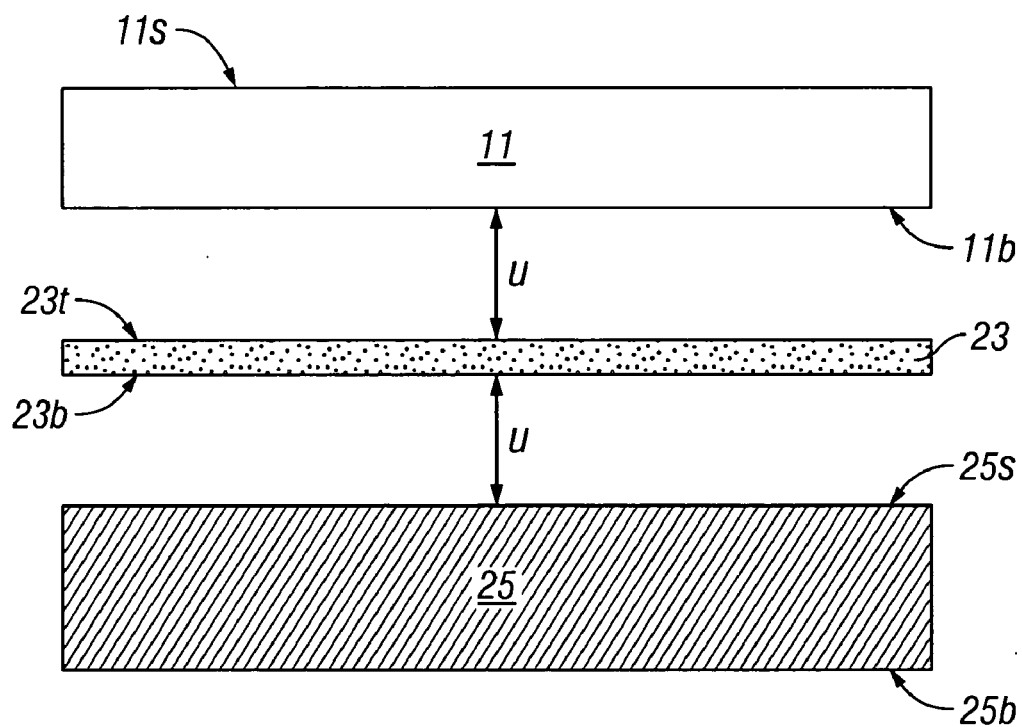
FIG. 7 is a cross-sectional view depicting a connecting of a substrate with a carrier substrate.

In FIG. 7, as one example of how the substrate 11 can be connected with the carrier substrate 25, a layer 23 of a double sided adhesive material including adhesive surfaces 23t and 23b can be used to adhesively connect the substrate 11 with the carrier substrate 25. A bottom surface 11b of the substrate 11 and a top surface 25s of the carrier substrate 25 can be urged U into contact with the adhesive surfaces (23t, 23b) to effectuate the connecting of the substrate 11 with the carrier substrate 25. Preferably, the carrier substrate 25 is a substantially planar along the top surface 25s so that the substrate 11 can be mounted on a flat surface. The carrier substrate 25 can be made from a variety of materials including but not limited to a semiconductor material, a metal, a plastic, a glass, a ceramic, a composite material, quartz, and a borosilicate glass, such as a PYREX™ glass, for example.

In FIGS. 6a through 6d, at a stage 105, the substrate 11 is singulated to separate the RFID chips 21 from one another with each RFID chip 21 forming a diesite (see diesites a-p in FIG. 9) that is connected with the carrier substrate 25. The singulating at the stage 105 can be accomplished using a process including but not limited to sawing, etching, cutting, scribing, or the like. For example, it is well understood in the microelectronics art that die on a semiconductor wafer can be either scribed or sawed to separate the die from one another. However, after the stage 105 the diesite 21 are still connected to the carrier substrate 25. The singulating forms a space 12s between adjacent diesites such that the diesites are no longer connected to one another but are still connected with the carrier substrate 25.

Figure 6B:
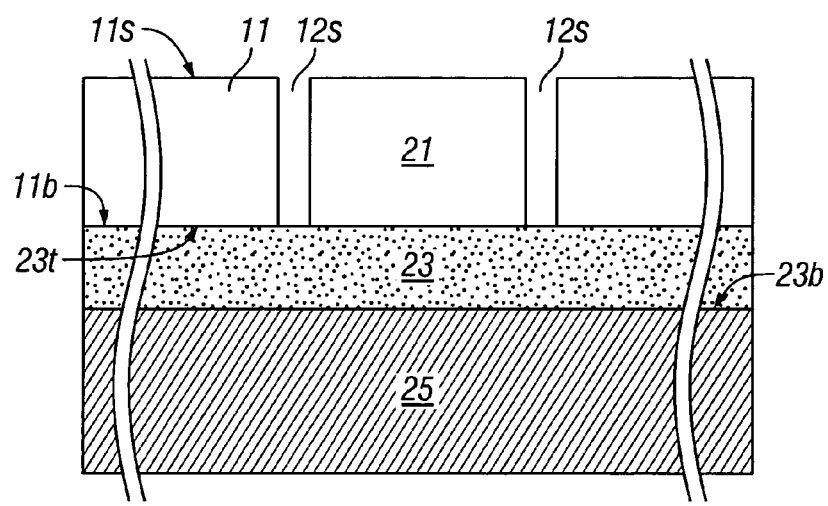
Figure 6C:
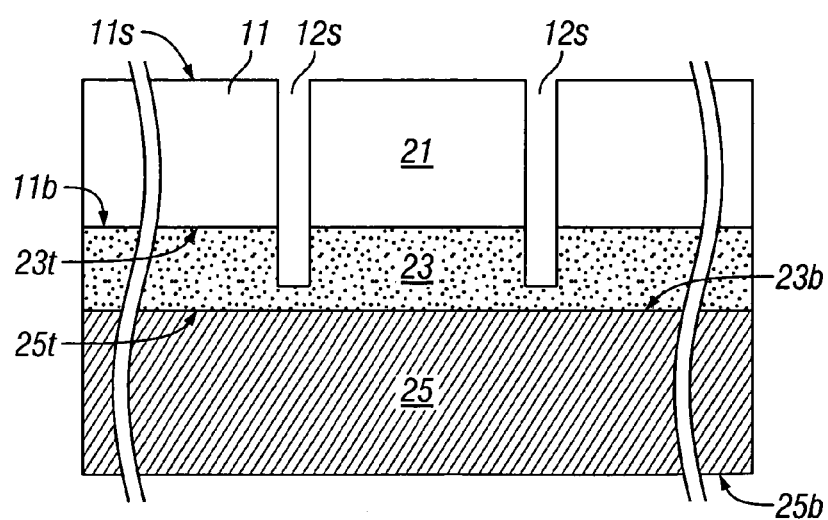
Figure 6D:
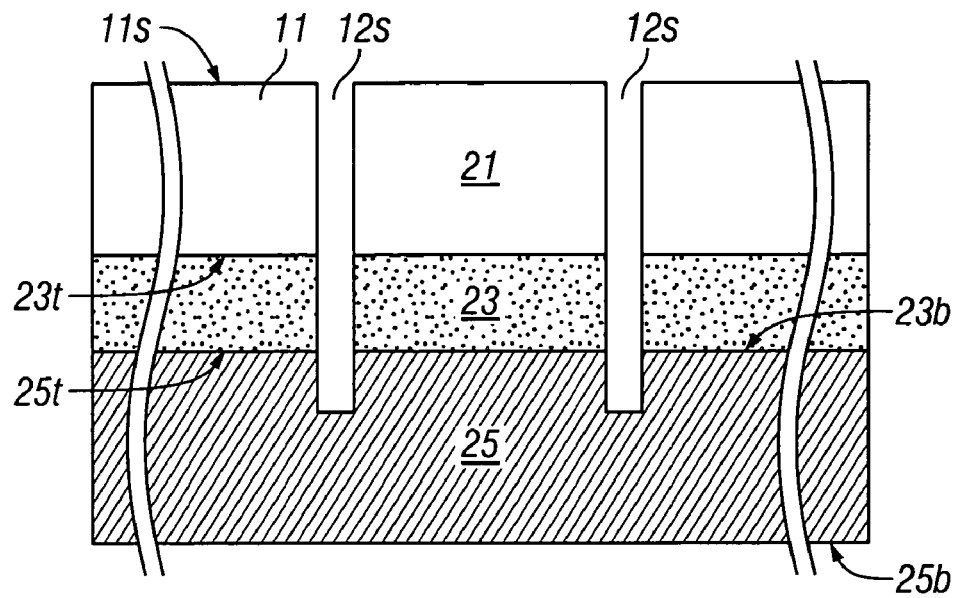

As one example, the singulating at the stage 105 can be accomplished using a saw to cut the spaces 12s in the substrate 11. The spaces 12s can be cut down to a bottom surface 11b of the substrate as depicted in FIG. 6b or the spaces 12s can be cut partially into or all the way through the layer 23 as depicted in FIG. 6c, where the spaces 12s are cut all the way through the substrate 11 and partially through the layer 23. As another example, in FIG. 6d, the spaces 12s can be cut all the way through the substrate 11 and the layer 23, but only partially through the carrier substrate 25.

Figure 8:
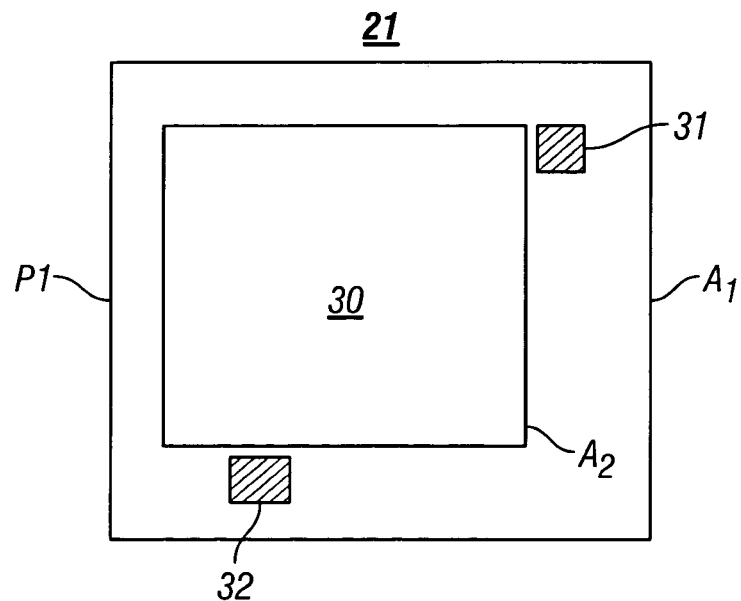
FIG. 8 is a top plan view depicting a RFID chip.
Figure 9:
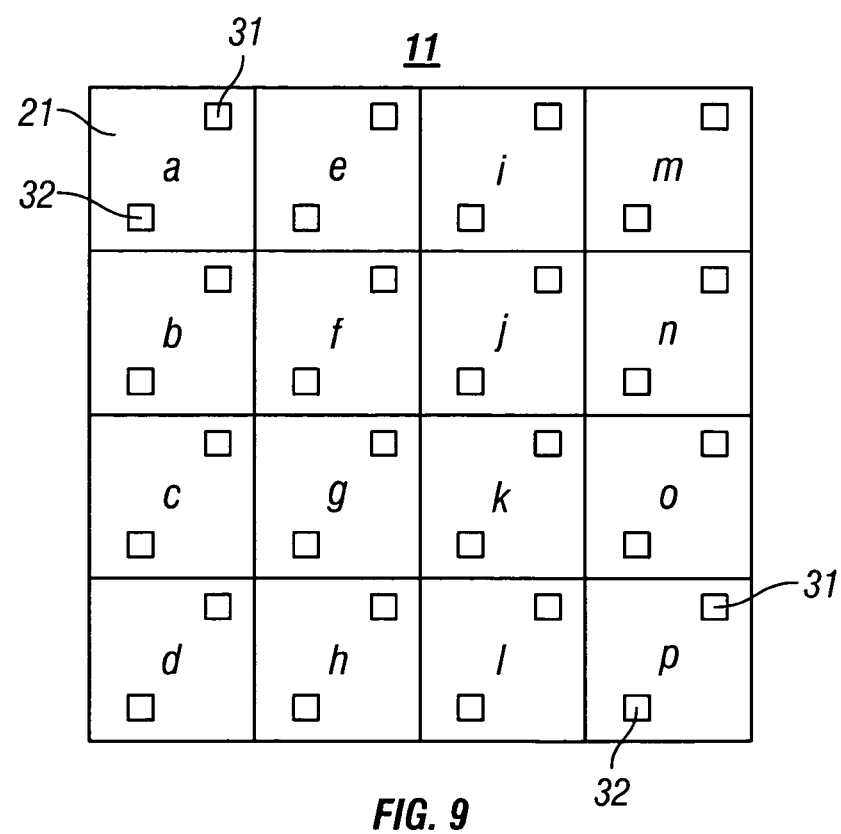
FIG. 9 is a top plan view depicting a plurality of diesites on a substrate.

In FIGS. 8 and 9, after the singulating at the stage 105, each RFID chip 21 comprises a diesite denoted as diesites a through p in FIG. 9. Although only sixteen diesites are depicted, the actual number of diesites will be application specific and may be determined by a total useable number of RFID chips 21 that were previously fabricated on the substrate 11. In FIG. 8, a RFID chip 21 has a perimeter P1 and can include circuitry 30, a first node 31, and a second node 32. One of ordinary skill in the art will appreciate that the circuitry 30 can include RF circuits, analog circuits, digital circuits, memory (e.g. ROM and/or RAM), a power source such as a battery, and other circuitry necessary to implement a passive or an active RFID tag. The first and second nodes (31, 32) can be electrically conductive bonding pads that are electrically connected with the circuitry 30. As will be described below, an antenna will be electrically connected with the first and second nodes (31, 32).

Figure 10A:
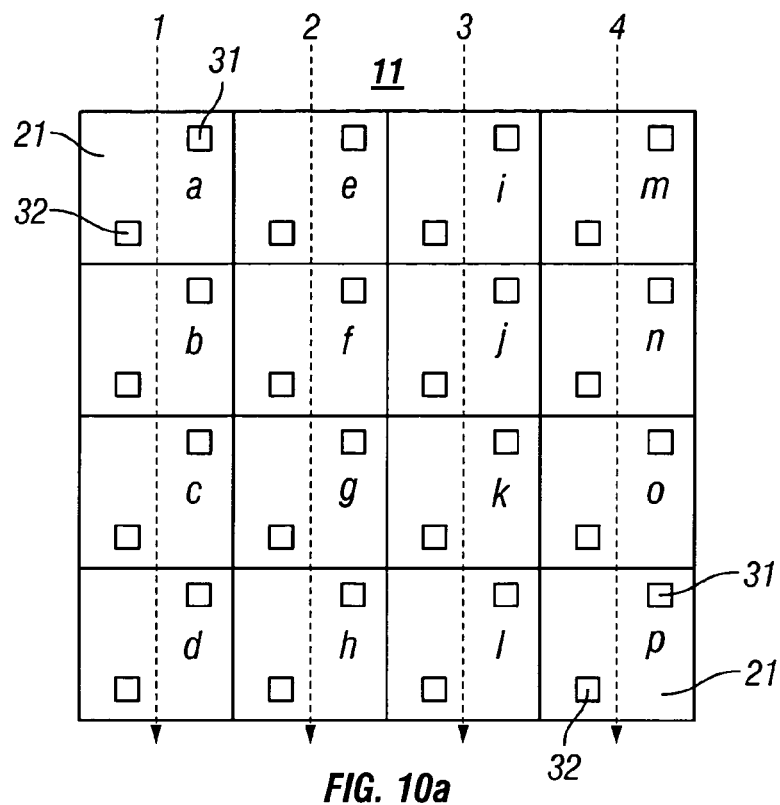
FIGS. 10a through 10d and are top plan views depicting a connecting of an antenna to a RFID chip in an assembly order.
Figure 10B:
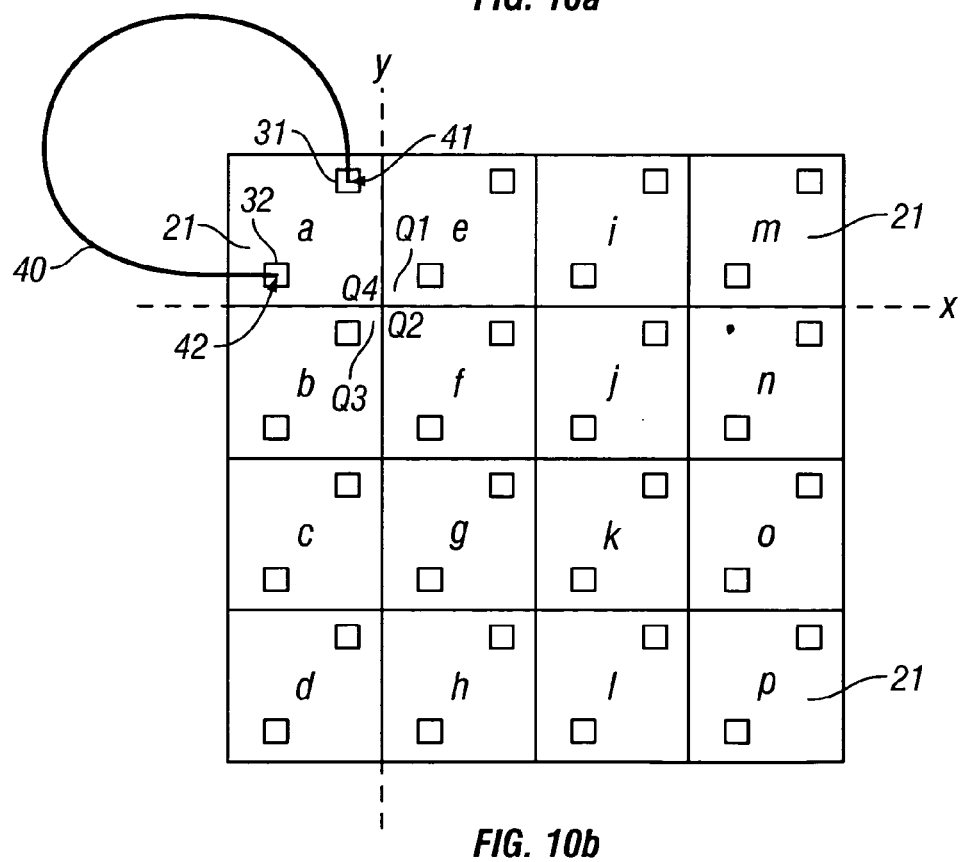
Figure 10C:
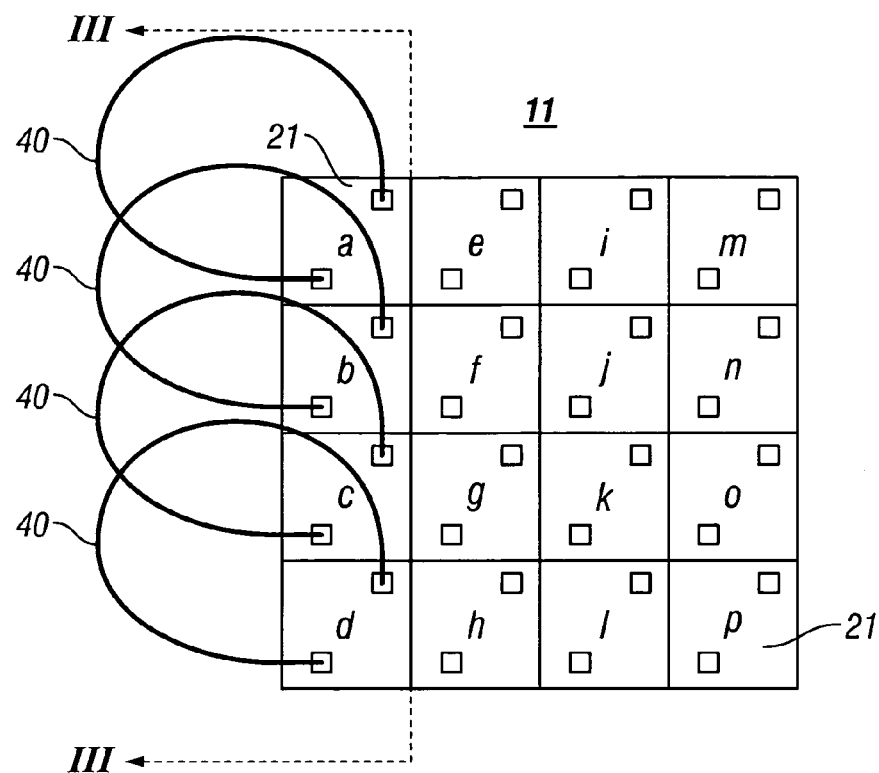

In FIGS. 10a through 10d, at a stage 107, an antenna 40 is connected with a selected RFID chip 21 in an assembly order. The assembly order is a predetermined order that is application specific and can be based on several factors including the shape of the substrate 11. For example, the assembly order may be different for the circular (e.g. wafer shaped) substrate 11 of FIG. 5b than the rectangular shaped substrate of FIG. 5a. As an example, in FIG. 10a, the assembly order comprises traversing down the columns of the substrate 11 as depicted by the dashed lines 1, 2, 3, and 4 so that the diesites are connected with the antenna 40 by moving down each column to connect the RFID chips 21 in that column with an antenna 40 and then moving to the next column in a left to right order. Therefore, the assembly order is:

a; b; c; and d for the column traversed by dashed arrow 1 (see FIG. 10c);

e; f; g and h for the column traversed by dashed arrow 2;

i; j; k and l for the column traversed by dashed arrow 3; and m; n; o and p for the column traversed by dashed arrow 4.

In FIG. 10b, the antenna 40 is connected with the diesite a. Connecting the antenna 40 with the RFID chip 21 can include connecting a first node 41 and a second node 42 of the antenna 40 with the first and second nodes (31, 32) respectively of the RFID chip 21. For example, a wire bonding machine can be used to connect the first and second nodes (41, 42) of the antenna with the first and second nodes (31, 32) of the RFID chip 21. The first and second nodes (31, 32) can be contact pads such as the type used in ASIC devices for connecting pads on a chip with bonding pads on a lead frame. The antenna 40 can be made from an electrically conductive material including but not limited to copper (Cu), aluminum (Al), or other bare or insulated wire. The antenna 40 can be a loop antenna as depicted in FIG. 10b, or the antenna 40 can have another shape tailored to a specific application.

The shape of the antenna 40 will be determined in part by a means used for forming and connecting the antenna 40 to the RFID chip 21. For example, if a wire bonding machine is used, then the accuracy with which the antenna 40 is positioned on the diesite and the shape of the antenna 40 will be determined by the capabilities of the wire bonding machine. The connecting of the antenna 40 is not to be construed as being limited to a wire bonding process and any process suitable for effectuating the connection can be used.

Figure 10D:
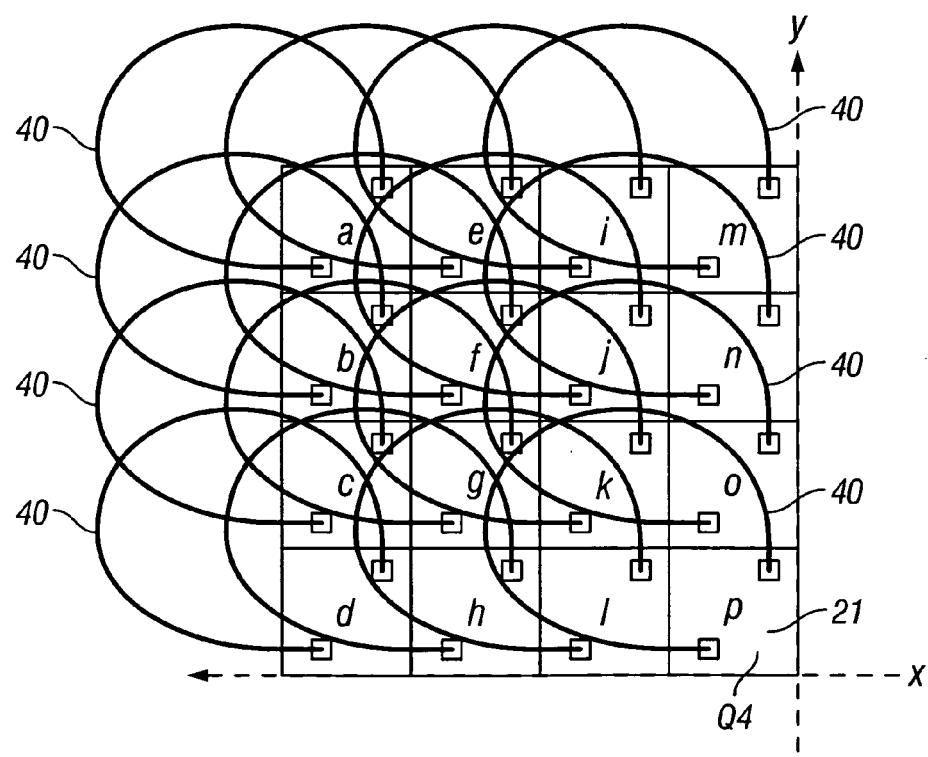

It is desirable to prevent entanglement of the antennas 40 with one another as additional antenna 40 are connected to their respective RFID chips 21. Entangled antennas can lead to damage to the antenna 40 and/or the RFID chip 21 when the RFID chip 21 is removed from the carrier substrate 25 as will be described below. One way to prevent entanglement is to control the shape of the antenna 40 and the position of the antenna 40 relative to the diesite. In FIG. 10b, the antenna 40 is positioned entirely within a quadrant Q4 defined by a diesite corner. The diesite corner is defined by the intersection of the x-y axes. In FIGS. 10c through 10d, the positioning of the antenna 40 entirely within the quadrant Q4 prevents entanglement of the antennas 40 with one another as they are connected to their respective RFID chips 21 and allows for the RFID chips 21 to be removed from the carrier substrate 25 in a disassembly order that prevents entanglement of the antennas 40 during a disassembly process to be described below.

Figure 11A:
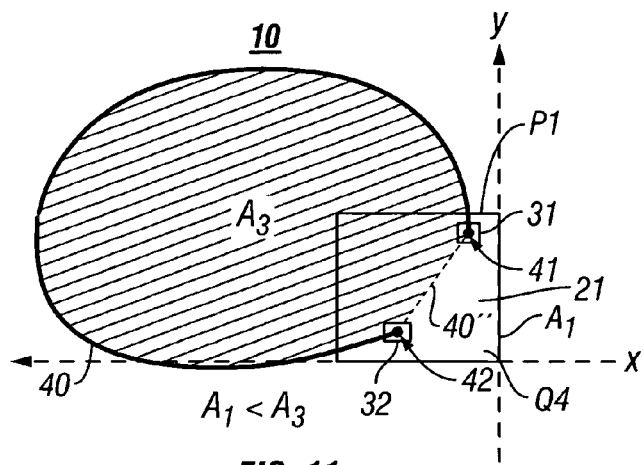

In FIG. 11a, one advantage of the antenna 40 is that the antenna 40 can be substantially larger than the RFID chip 21 that the antenna 40 is connected with. For example, if the RFID chip 21 has an area $A_1$ determined by a width and a height of the diesite, the antenna 40 can enclose an area $A_3$ that is substantially larger than the area $A_1$. The area $A_3$ is measured between an interior perimeter of the antenna 40 and a dashed line 40". As an example, if the RFID chip 21 has dimensions of (0.5 mm*0.5 mm) so that the area $A_1$ is 0.25 mm², then the area $A_3$ enclosed by the antenna 40 can be several times larger than the area $A_1$, such as ten times the area $A_1$ so that $A_3$ is 2.5 mm² (i.e. 10*0.25 mm²). Accordingly, for a very small RFID chip 21, the antenna 40 can be much larger with the resulting advantages of a low cost per unit of area $A_1$ for the RFID chip 21 and a large, low cost, connected antenna 40 that has the performance advantages of the aforementioned prior large external antenna.

Figure 11B:
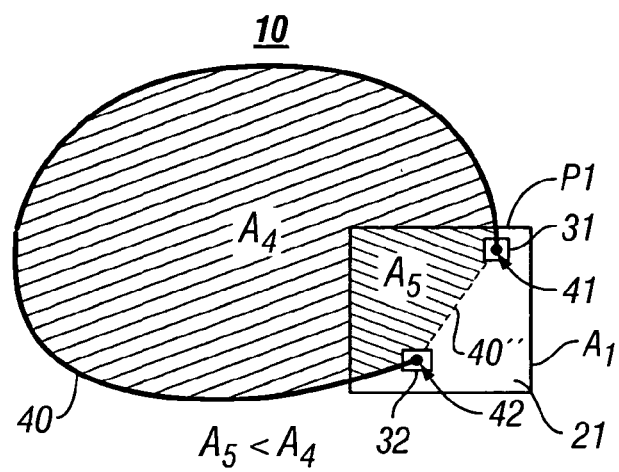
FIG. 11b is a top plan view depicting an antenna including an area positioned inside a perimeter and outside a perimeter of a RFID chip.

In FIG. 11b, another advantage of the antenna 40 is that it includes a first portion (denoted as an area $A_5$) positioned inside the perimeter P1 of the RFID chip 21 and the first portion is positioned opposite the quadrant Q4 defined by the diesite corner (i.e. the x-y axes). The antenna 40 also includes a second portion (denoted as an area $A_4$) that is positioned outside the perimeter of the RFID chip 21 the antenna 40 is connected with. The area $A_4$ of the second portion is greater than the area $A_5$ of the first portion and the area $A_4$ is also greater than the area $A_1$ of the RFID chip 21.

Consequently, the area $A_4$ of the antenna 40 that is positioned off-chip (i.e. outside the perimeter of the RFID chip 21) can be substantially larger than the area $A_1$ of the RFID chip 21.

In FIGS. 10c and 10d and referring to FIG. 4a, at a stage 109, the process of connecting another antenna 40 with another RFID chip 21 in the assembly order can be repeated as necessary. Each successively connected antenna 40 overlaps a previously connected antenna 40 as depicted in FIGS. 10c and 10d. The connecting process may be used to connect antennas 40 to all of the available diesites a-p (see FIG. 10d) or only a subset of the diesites can have antennas 40 connected therewith. For example, only the diesites a-h can have antennas 40 connected therewith in the assembly order for columns 1 and 2.

As depicted in FIGS. 10c and 10d the connected antennas 40 partially overlap one another as they are successively connected in the assembly order. For example, in FIG. 10c, a portion of the antenna 40 at diesite b overlaps the antenna 40 at diesite a. Similarly, a portion of the antenna 40 at diesite c overlaps the antenna 40 at diesite b and a portion of the antenna 40 at diesite d overlaps the antenna 40 at diesite c.

Moreover, as additional antenna 40 are connected, the number of antennas 40 that are overlapped by another antenna 40 increases. For example, the antenna 40 at the diesite p overlaps portions of the antennas 40 at diesites o, j, k, l, g, and h; however, the antenna 40 at the diesite p is also positioned above all of the antenna 40 that it overlaps so that is will not become entangled with those antenna 40 when the RFID chip 21 at the diesite p is removed from the carrier substrate 25.

Figure 10E:
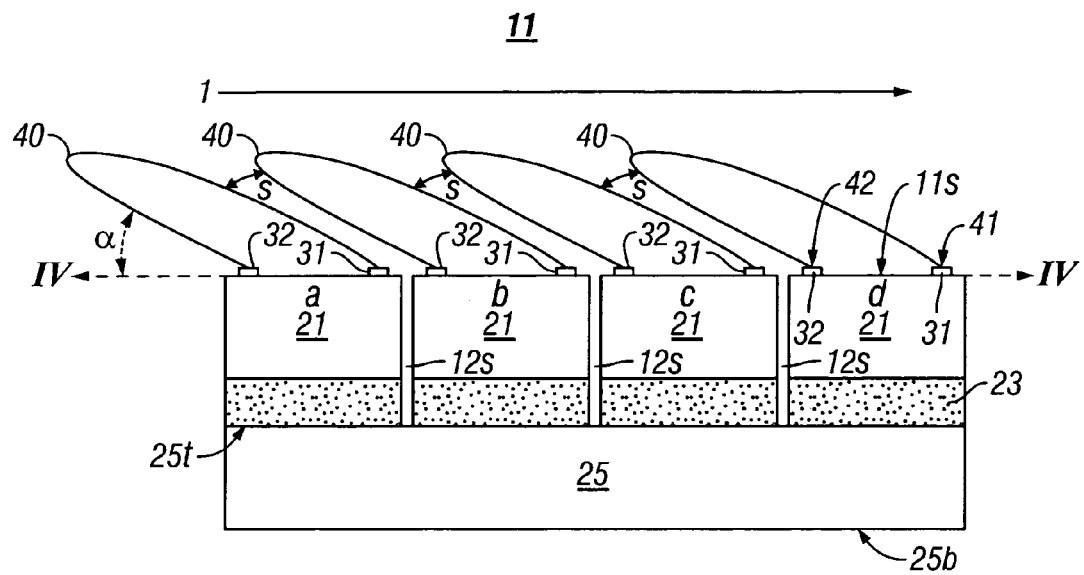
FIG. 10e is a cross-sectional view along a line III-III of FIG. 10c.

In FIG. 10e, a cross-sectional view of the diesites a-d of FIG. 10c, the connected antennas 40 may be spaced apart S from one another such that the antennas 40 are not touching each one another. The antennas 40 may extend substantially a out-of-plane of the surface 11s of the substrate 11 as denoted by an angle α between the antenna 40 and a line IV-IV that is coplanar with the surface 11s. Consequently, the spatial relationship between the antennas 40 allows for a disassembly order that prevents the antennas 40 from entangling with or interfering with one another as they are removed from the carrier substrate 25. Therefore, in FIG. 10e, when diesite d is removed from the carrier substrate 25 prior to the removal of diesite C, the antenna 40 at diesite d will not snag or otherwise interfere with the antenna at diesite c.

Figure 13A:
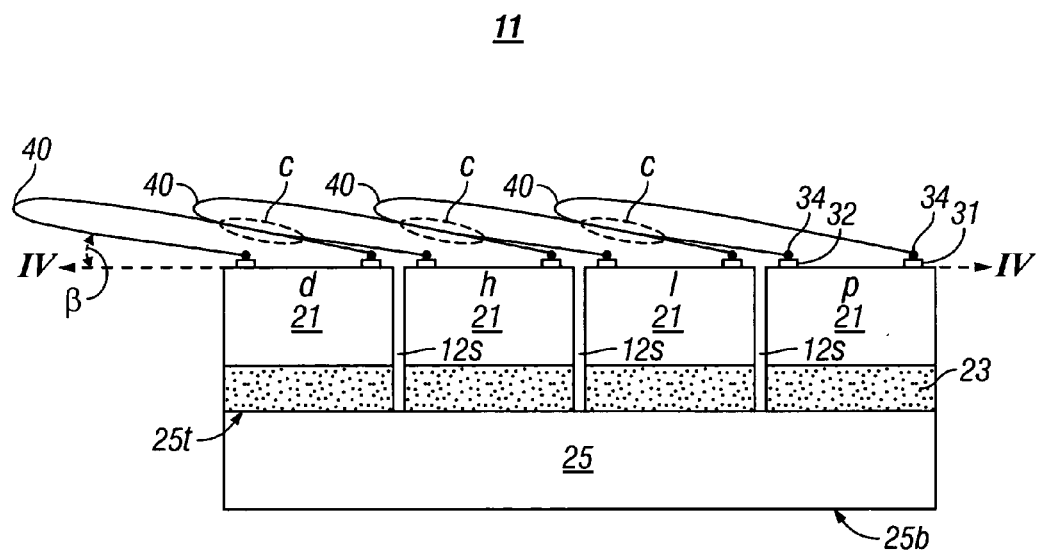
FIG. 13a is a cross-sectional view depicting antennas that are in contact with one another.

As was describe above, the actual shape and spatial relationship between the antennas 40 will be determined in part by an accuracy of the means used to connect the antennas 40 with their respective diesites. In contrast, in FIG. 13a, the connected antennas 40 can include a portion that is in contact with an adjacent antenna 40 as denoted by a dashed oval C. The antenna 40 may also lay closer to the plane IV-IV as denoted by an angle β that is closer to the plane IV-IV than the angle α of FIG. 10e.

In FIG. 4a, after the stage 109, if all desired diesites have an antenna 40 connected therewith, then the connection process can be terminated at the stage 131. The substrate 11 can then be stored or shipped for later disassembly of the diesites from the carrier substrate 25. The RFID chip 21 with a connected antenna 40 comprises a RFID tag.

Figure 14A:
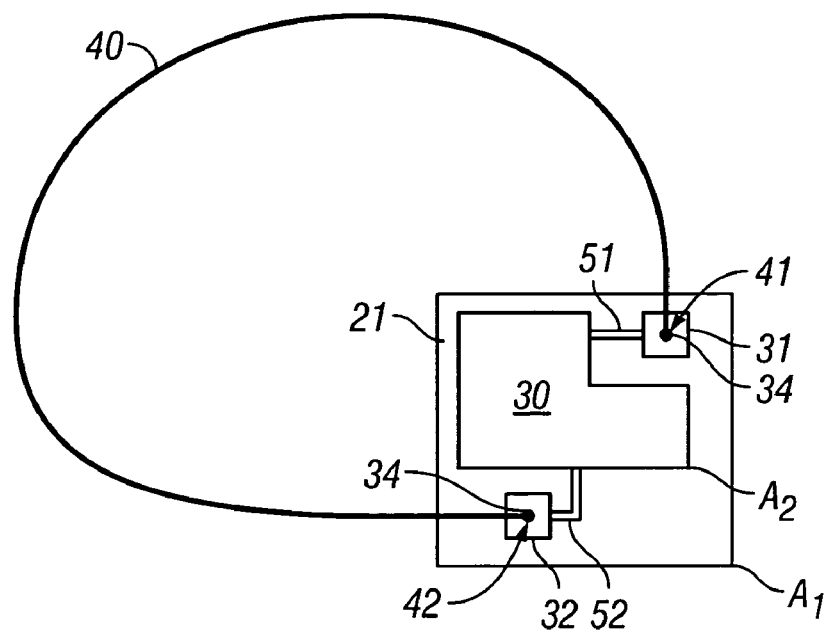
FIG. 14a is a top plan view depicting a connecting of nodes on an antenna and a RFID chip.

In FIG. 14a, a RFID tag 10 includes the RFID chip 21, a connected antenna 40, and circuitry 30. The circuitry 30 can have an area $A_2$ that is less than the area $A_1$ of the RFID chip 21 and the circuitry 30 can be electrically connected with the first and second nodes (31, 32) by electrically conductive traces (51, 52). An electrical connection between the first and second nodes (41, 42) of the antenna 40 and the first and second nodes (31, 32) of the RFID chip 21 can be made using solder balls 34 or the like.

Figure 12A:
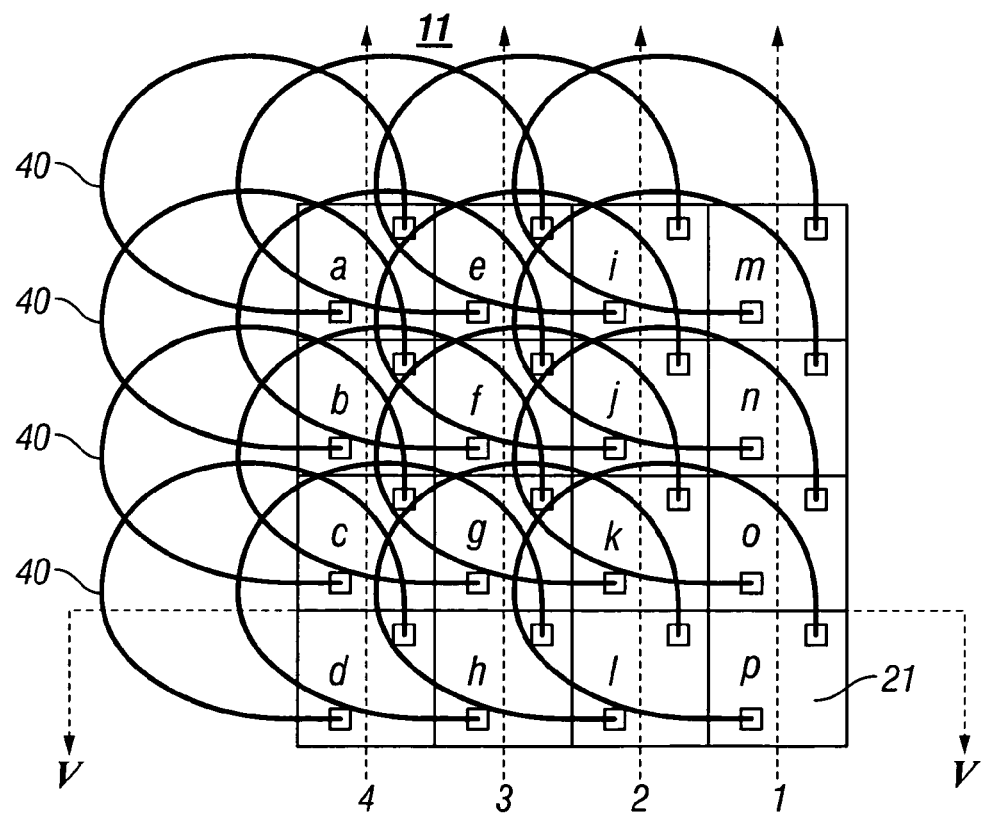
FIGS. 12a through 12c are top plan views depicting a removing of a RFID tag from a carrier substrate in a disassembly order.
Figure 12B:
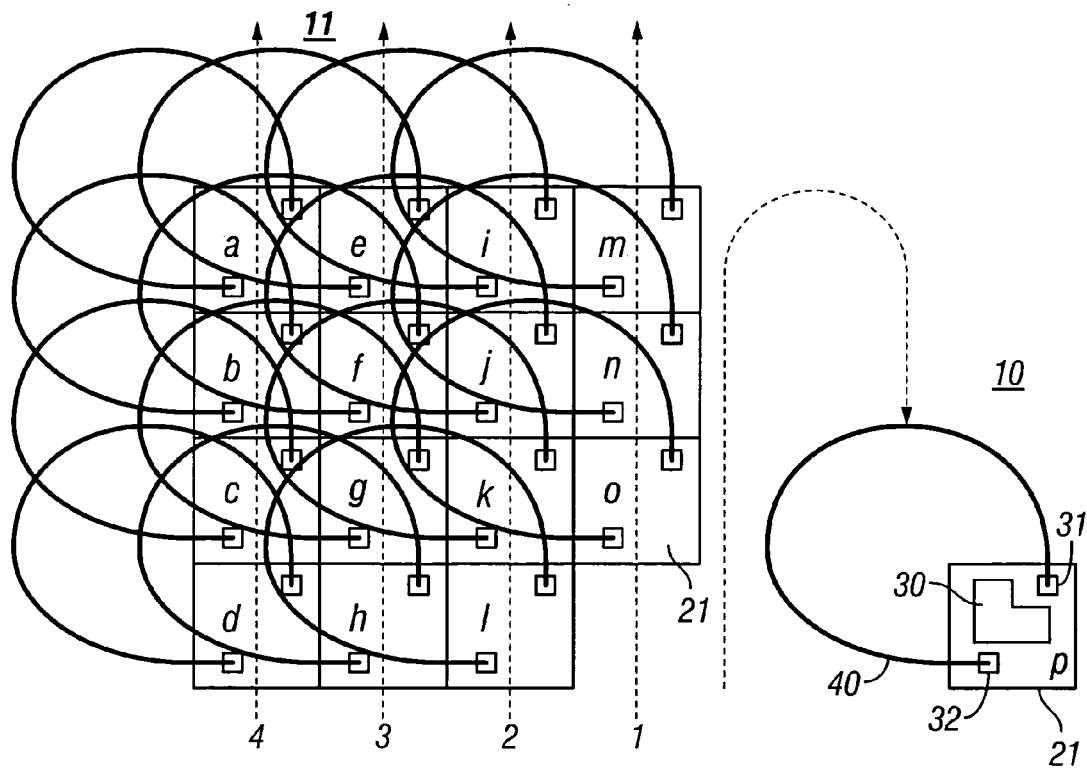
Figure 12C:
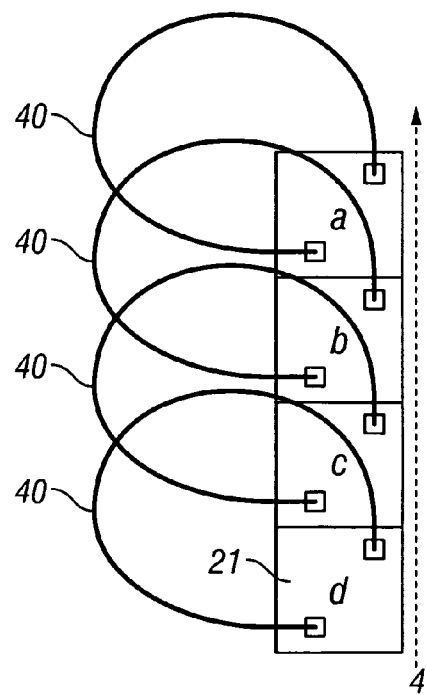

However, after the connecting process is completed, it may be desirable to disassemble the diesites from the carrier substrate 25. In FIGS. 12a through 12c and referring to FIG. 4b, at a stage 111, each RFID tag 10 is removed from the carrier substrate 25 in a disassembly order denoted by dashed arrows 1-4. Preferably, the disassembly order is opposite the assembly order.

Therefore, a disassembly order opposite the assembly order would be:

p; o; n; and m for the column traversed by dashed arrow 1 (see FIG. 12b);

l; k; j and i for the column traversed by dashed arrow 2;

h; g; f and e for the column traversed by dashed arrow 3; and d; c; b and a for the column traversed by dashed arrow 4.

Accordingly, in FIG. 12b the first RFID tag 10 to be removed from the carrier substrate 25 is the diesite p. The removing process continues until all desired diesites have been removed from carrier substrate 25. Therefore, in FIG. 12c, diesites p-e have been removed and diesites d-a remain to be removed in the disassembly order denoted by the dashed arrow 4, that is d; c; b and a. The removing at the stage 111 can be accomplished by a variety of methods. For example, in FIG. 12d, if the layer 23 is made from a temperature sensitive material that, melts, softens, or the like when heated, then the substrate 11, the carrier substrate 25, or the substrate 11 and the carrier substrate 25 can be heated H to cause the layer 23 to lose its adhesive or other connecting properties so that the RFID tag 10 at the diesite can be extracted from the carrier substrate 25. One of ordinary skill in the art will appreciate that other methods can be used to remove the RFID tags 10 and the present invention is not limited to the aforementioned heating H. For example, a solvent can be applied to the layer 23 to effectuate the removing at the stage 111.

Figure 12D:
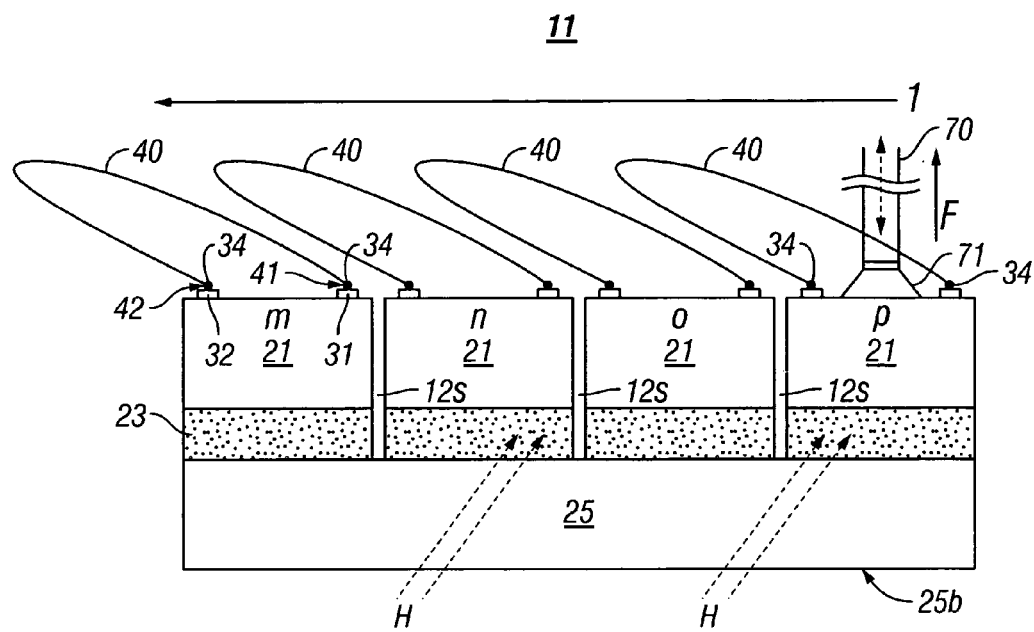
FIG. 12d is a cross-sectional view depicting a method of removing a RFID chip from a carrier substrate.

In FIG. 12d, the removing at the stage 111 can include using a pick-and-place machine 70 to remove the RFID tag 10 from the carrier substrate 25. For example, an end effector 71 of the pick-and-place machine 70 can contact the surface 11s of the diesite and apply a vacuum to create suction and a force F can be used to pull the diesite p off of the carrier substrate 25. The present invention is not to be construed as being limited to the use of a pick-and-place machine to effectuate the removing at the stage 111 and other processes for removing a diesite from the carrier substrate 25 can be used. Regardless of the process used, it is important that the process not damage the antenna 40, the RFID chip 21, or adjacent RFID chips 21 and their antenna 40.

Figure 4B:
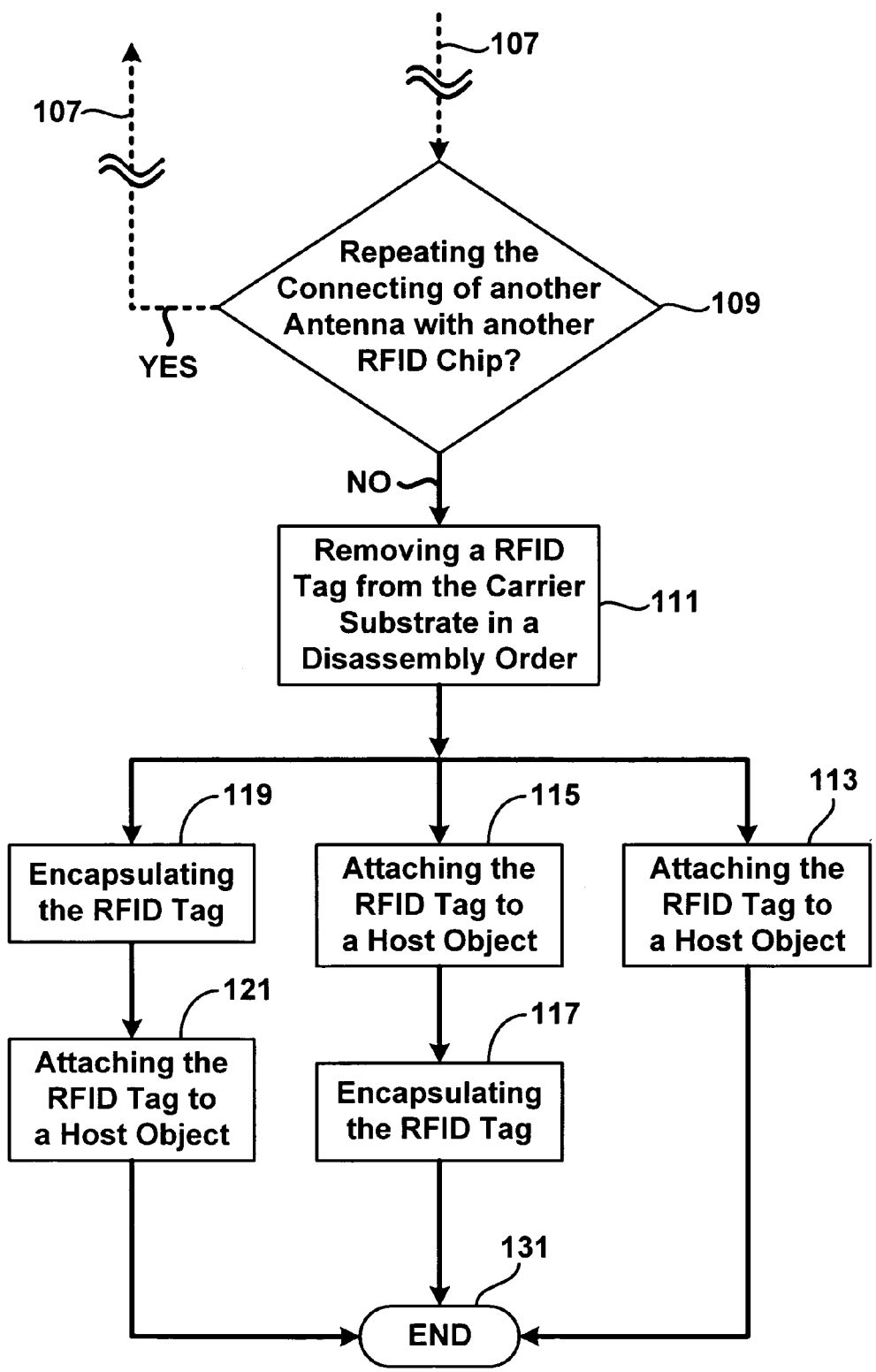
Figure 14B:
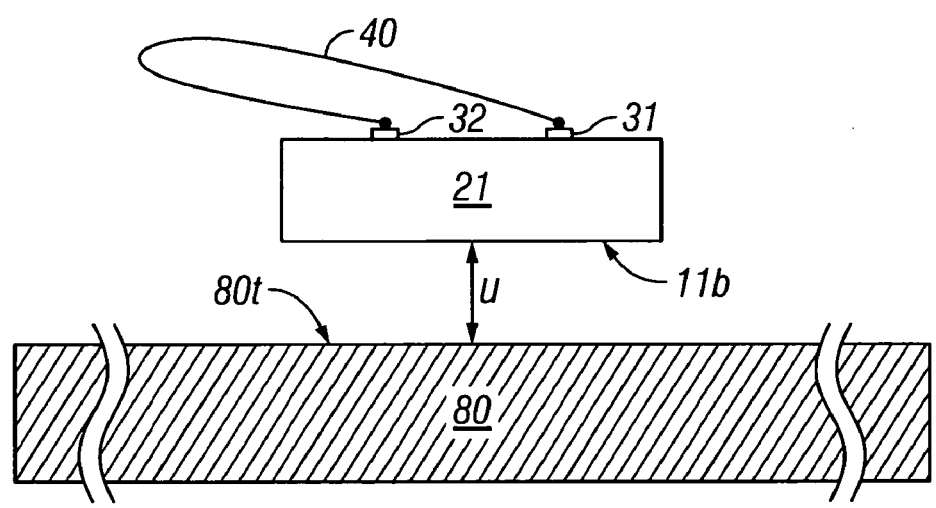
FIG. 14b is a cross-sectional view depicting a connecting of a RFID tag with a host object.

In FIG. 14b and referring to FIG. 4b, after the removing at the stage 111, at a stage 113, the RFID tag 10 can be attached to a host object 80. The RFID tag 10 and the host object 80 can be urged U into contact with each other. A glue, an adhesive, or the like, can be applied to a surface 80t of the host object and/or the surface 11b of the RFID tag 10 to connect the RFID tag 10 and the host object 80 with each other.

The host object 80 can be any object it is desirable to attach the RFID tag 10 to and includes but is not limited to an article of manufacture, a product, a piece of luggage, a vehicle, a food article, an animal, a person, a negotiable instrument, and currency. A pick-and-place machine can be used to attach the RFID tag 10 to the host object 80. The pick-and-place machine can be the same pick-and-place machine 70 used to remove the RFID tag 10 from the carrier substrate 25.

Figure 14C:
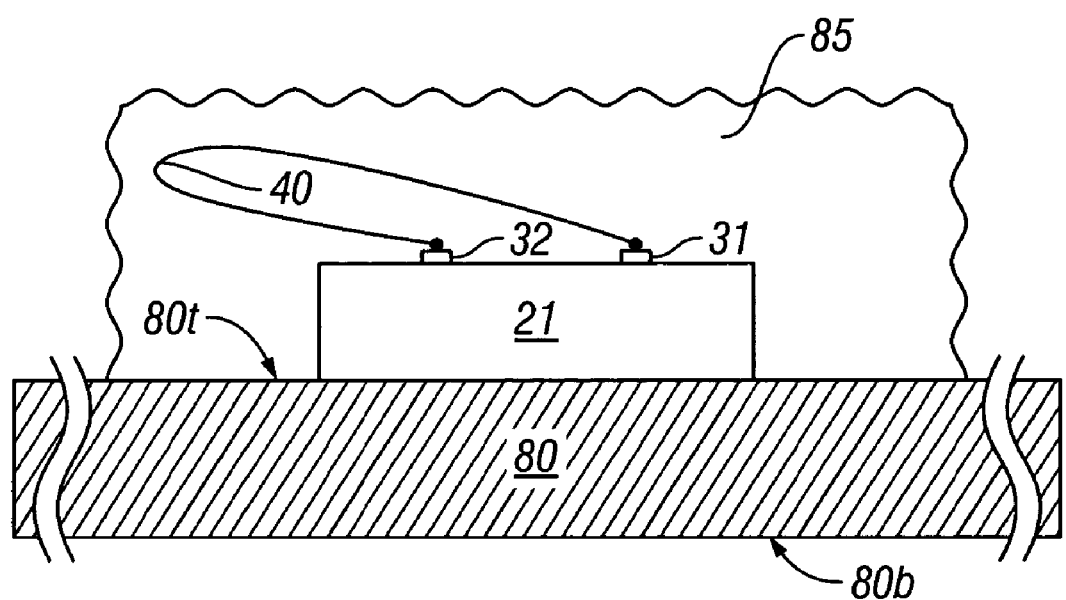
FIG. 14c is a cross-sectional view depicting an encapsulated RFID tag.

In FIG. 14c, at a stage 115, the RFID tag 10 can be attached to a host object 80 as was described above, and then at a stage 117, the RFID tag 10 can be encapsulated.

Alternatively, at a stage 119, the RFID tag 10 can be encapsulated 85 prior to being attached to the host object at a stage 121. An encapsulating material 85 can be used to cover, conformally coat, protect, or otherwise electrically insulate the antenna 40 and the RFID chip 21. Suitable encapsulating materials include but are not limited to silicone rubber, polydimethylsiloxane (PDMS), a polymer, and Paralene™. As an example, a PDMS material such as a DuPont® Sylgard™ can be used to form a coating that encapsulates the RFID tag 10.

Another advantage to the method described herein is that the antennas 40 need not all be of the same size and shape. Accordingly, the connecting process at the stage 107 can include connecting antennas 40 in the assembly order that vary in size, shape, or size and shape among the diesites a-p. It is important to ensure that the antennas 40 properly overlap one another as described above and that the variations in shape and/or size among the antennas 40 will not lead to entanglement so that at the stage 111, the RFID tags 10 can be removed in the disassembly order without damage to the RFID chips 21 or their respective antennas 40.

Moreover, the method described herein is also amendable to connecting an antenna 40 that is slightly larger than the perimeter P1 would allow in those situations in which the size of the antenna 40 must be larger than the prior on-chip antenna due to the upper limit set by P1, but the performance parameters of the antenna 40 don't require that it be substantially larger than the RFID chip 21.

Although several embodiments of the present invention have been disclosed and illustrated, the invention is not limited to the specific forms or arrangements of parts so described and illustrated. The invention is only limited by the claims.

What is claimed is:

1. A method of fabricating an antenna on a substrate including a plurality of previously fabricated RFID chips, comprising:
    connecting the substrate with a carrier substrate;
    singulating the substrate to separate the plurality of RFID chips into a plurality of diesites;
    connecting in an assembly order, the antenna with a selected RFID chip to form a RFID tag; and
    repeating the connecting of another antenna with another RFID chip in the assembly order with each successively connected antenna overlapping a previously connected antenna.

2. The method as set forth in claim 1 and further comprising:
    removing each RFID tag from the carrier substrate in a disassembly order.

3. The method as set forth in claim 2, wherein the disassembly order is opposite the assembly order.

4. The method as set forth in claim 2, wherein the removing comprises heating a selected one of the substrate, the carrier substrate, or the substrate and the carrier substrate to effectuate the removing of each RFID tag from the carrier substrate.

5. The method as set forth in claim 2, wherein the removing comprises using a pick-and-place machine to remove the RFID tag from the carrier substrate.

6. The method as set forth in claim 5 and further comprising:
    using the pick-and-place machine to attach the RFID tag to a host object.

7. The method as set forth in claim 2 and further comprising after the removing:
    encapsulating the RFID tag.

8. The method as set forth in claim 2 and further comprising after the removing:
    attaching the RFID tag with a host object.

9. The method as set forth in claim 8 and further comprising after the attaching:
    encapsulating the RFID tag.

10. The method as set forth in claim 1, wherein the connecting the substrate with the carrier substrate comprises a selected one of adhesively connecting the substrate with the carrier substrate or gluing the substrate and the carrier substrate to each other.

11. The method as set forth in claim 10, wherein the adhesively connecting comprises connecting the substrate with the carrier substrate using a layer of a double sided adhesive material.

12. The method as set forth in claim 1, wherein the connecting the antenna comprises electrically connecting a first node of the antenna with a first node of the RFID chip and electrically connecting a second node of the antenna with a second node of the RFID chip.

13. The method as set forth in claim 12, wherein the connecting comprises using a wire bonding machine to connect the first and second nodes of the antenna with the first and second nodes of the RFID chip.

14. The method as set forth in claim 1, wherein the antenna is a loop antenna.

15. The method as set forth in claim 1, wherein after the connecting, the antenna is positioned entirely within a quadrant defined by a diesite corner.

16. The method as set forth in claim 15, wherein the antenna includes a first portion positioned inside a perimeter of the AFID chip and opposite the quadrant defined by the diesite corner and a second portion positioned outside the perimeter of the RFID chip the antenna is connected with, and the second portion includes an area that is greater than an area of the RFID chip.

17. The method as set forth in claim 1, wherein a selected one of a shape of the antenna, a size of the antenna, or a shape of the antenna and a size of the antenna varies among the diesites.

* * * * *